(12) United States Patent
Murakami (10) Patent No.: US 6,681,695 B2
(45) Date of Patent: Jan. 27, 2004

(54) CONTINUOUS PRINTING AND MOUNTING APPARATUS FOR FILM-LIKE PRINTING BODY

(75) Inventor: Takehiko Murakami, Fuchu (JP)

(73) Assignee: Minami Co., Ltd., Tokyo (JP)

( * ) Notice: Subject to any disclaimer, the term of this patent is extended or adjusted under 35 U.S.C. 154(b) by 0 days.

(21) Appl. No.: 10/229,742

(22) Filed: Aug. 28, 2002

(65) Prior Publication Data

US 2003/0051617 A1 Mar. 20, 2003

(30) Foreign Application Priority Data

Sep. 17, 2001 (JP) .................................. 2001-280921

(51) Int. Cl.[7] .............................................. B65H 23/22
(52) U.S. Cl. ........................ 101/228; 101/121; 101/122; 101/DIG. 42; 226/29; 226/24; 226/32
(58) Field of Search ................................. 101/121, 122, 101/129, 248, DIG. 42, 228, 231; 226/2, 24, 29, 32, 57, 62, 63, 75, 115

(56) References Cited

U.S. PATENT DOCUMENTS 4,848,630 A * 7/1989 Niestrath et al. ............... 226/4
6,119,592 A * 9/2000 Nishikawa et al. ......... 101/121
6,474,886 B1 * 11/2002 Sugiyama et al. .......... 400/634
6,499,397 B2 * 12/2002 Stern ........................... 101/248
6,546,871 B1 * 4/2003 Glockner .................... 101/484

\* cited by examiner

Primary Examiner—Andrew H. Hirshfeld
Assistant Examiner—Kevin D. Williams
(74) Attorney, Agent, or Firm—R. Neil Sudol; William Sapone; Henry Coleman (57) ABSTRACT

A tension is applied to a film-like printing body to be processed in each of steps such as a printing step, a parts mounting step and the like. Further the processed film-like printing body is automatically fed out by a predetermined stroke. A supply unit (1), a printing unit (2), parts mounting units (3, 4), a heating unit (5) and a take-up unit (6) are sequentially arranged. Tension apparatuses (7, 7) which apply a tension to the film-like printing body during a process and automatically feed out the processed film-like printing body are arranged between the respective units among the supply unit (1), the printing unit (2), the parts mounting units (3, 4) and the heating unit (5). A tension apparatus (7') which makes common cause in applying a tension to the film-like printing body during the process of the film-like printing body performed by the heating unit (5) and automatically feeds out the film-like printing body after the process by a predetermined stroke is arranged between the heating unit (5) and the take-up unit (6).

6 Claims, 7 Drawing Sheets

CONTINUOUS PRINTING AND MOUNTING APPARATUS FOR FILM-LIKE PRINTING BODY

BACKGROUND OF THE INVENTION

1. Field of the Invention

The present invention relates to a continuous printing and mounting apparatus for a film-like printing body which executes a printing operation applied to a film-like printing body and a mounting operation of parts in accordance with a continuous process.

2. Conventional Art

In a conventional continuous printing and mounting apparatus for a film-like printing body which executes a printing operation applied to a film-like printing body and a mounting operation of parts, there is not provided a tensioning means for applying a tension to the film-like printing body in each of the processing steps.

Accordingly, for example, in a printing step, a printing agent is insufficiently applied, or a profile of the applied printing agent becomes indistinct. Further, in the parts mounting step, there is easily generated a matter that the parts are incompletely connected, the parts are shifted from a regular position, or the like.

Further, the film-like printing body is fed by one pitch after the process is finished in each of the steps, however, this is conventionally achieved on the basis of a take-up operation by means of a take-up unit which is positioned at the last of each of the processing units. Further, in this case, it is necessary to pull a good length of film-like printing body at a time, and accordingly a considerable resistance is applied.

Accordingly, the film-like printing body is wound up while being strongly pulled at a time when the film-like printing body is taken up by a take-up reel in a take-up unit, and the wound film-like printing body is wound up in a considerably strong manner.

Further, in order to prevent the parts mounted on the film-like printing body from being crushed at a time of taking up the film-like printing body, a dummy tape having a suitable thickness is interposed between the respective layers of the wound film-like printing body along a longitudinal direction thereof, however, since the wound film-like printing body is wound up in a considerably strong manner as mentioned above, an interval between the respective layers of the wound film-like printing body becomes narrow on some occasions, so that the mounted parts may be deformed or the connection parts may come off.

SUMMARY OF THE INVENTION

The present invention is made by taking the points mentioned above into consideration, and an object of the present invention is to provide a continuous printing and mounting apparatus for a film-like printing body which applies a suitable tension to a film-like printing body to be processed in each of steps such as a printing step, a parts mounting step and the like, and feeds the film-like printing body by one pitch after finishing the process in each of the steps all at once by the same stroke by using a plurality of tension apparatuses which are respectively arranged between the processing units in the respective steps in correspondence to a take-up operation by a take-up unit, whereby a whole of the conventional problems can be solved.

Then, in accordance with an aspect of the present invention, there is provided a continuous printing mounting apparatus for a film-like printing body comprising:
a supply unit for a film-like printing body;
a printing unit which applies printing to the film-like printing body;
a part mounting unit which mounts parts on the printed film-like printing body;
a heating unit which heats the parts mounted film-like printing body; and
a take-up unit for the film-like printing body which mounts the parts thereon and is heated,
wherein the units are sequentially arranged along a moving direction of the film-like printing body, tension apparatuses which apply a tension to the film-like printing body during a process of the film-like printing body and are capable of automatically feeding out the processed film-like printing body by a predetermined stroke are arranged between the respective units among the supply unit, the printing unit, the parts mounting unit and the heating unit, and a tension apparatus which makes common cause in applying a tension to the film-like printing body during the process of the film-like printing body performed by the heating unit and automatically feeds out the film-like printing body after the process by a predetermined stroke is arranged between the heating unit and the take-up unit.

Further, in the structure mentioned above, as each of the tension apparatuses which are arranged between the respective units among the supply unit, the printing unit, the parts mounting unit and the heating unit, it is desirable to employ a structure constituted by a frame-like supporting table which is mounted to an upper portion of a base table so as to move upward and downward at a suitable timing and has a cover, a tension clamp which is arranged in a front end side in a moving direction of the film-like printing body on an upper surface of the frame-like supporting table, is mounted so as to move along the moving direction of the film-like printing body and clamps both end portions of the film-like printing body in a width direction at a suitable timing, a suitable pushing means for pushing the tension clamp to a front side in the moving direction of the film-like printing body by a predetermined stroke, a tension coil spring which energizes the tension clamp pushed by a cylinder toward a direction of being pulled back and has a suitable elasticity, a fixing clamp which is arranged in a rear side of the tension clamp in the moving direction of the film-like printing body on the upper surface of the frame-like supporting table so as to be close to the tension clamp and clamps both end portions of the film-like printing body in the width direction at a suitable timing, a feeding clamp which is arranged in a rear end side in the moving direction of the film-like printing body on the upper surface of the frame-like supporting table, is mounted so as to move along the moving direction of the film-like printing body, clamps both end portions of the film-like printing body in the width direction at a suitable timing and feeds out the processed film-like printing body by a predetermined stroke, a suitable moving means for moving the feeding clamp at a predetermined timing, in a predetermined direction and by a predetermined stroke along the moving direction of the film-like printing body, and a fixing clamp which is arranged in a rear side of the feeding clamp in the moving direction of the film-like printing body on the upper surface of the frame-like supporting table so as to be close to the feeding clamp, and clamps both end portions of the film-like printing body in the width direction at a suitable timing.

Further, in the structure mentioned above, as the pushing means for the tension clamp, it is desirable to employ a cylinder which is fixed to the frame-like supporting table along the moving direction of the film-like printing body.

Further, in the structure mentioned above, as the moving means for the feeding clamp, it is desirable to employ a moving means constituted by a screw shaft which is arranged along the moving direction of the film-like printing body, a connection plate which is connected to a supporting body of the feeding clamp provided with a screw hole engaging with the screw shaft, and a drive motor which is fixed to the frame-like supporting table and connected to the screw shaft.

Further, in the structure mentioned above, as the tension apparatus which is arranged between the heating unit and the take-up unit, it is desirable to employ a structure constituted by a frame-like supporting table which is mounted to an upper portion of a base table so as to move upward and downward at a suitable timing and has a cover, a fixing clamp which is arranged in a front end side in a moving direction of the film-like printing body on an upper surface of the frame-like supporting table and clamps both end portions of the film-like printing body in a width direction at a suitable timing, a feeding clamp which is arranged in a rear end side in the moving direction of the film-like printing body on the upper surface of the frame-like supporting table, is mounted so as to move along the moving direction of the film-like printing body, clamps both end portions of the film-like printing body in the width direction at a suitable timing and feeds out the processed film-like printing body by a predetermined stroke, a suitable moving means for moving the feeding clamp at a predetermined timing, in a predetermined direction and by a predetermined stroke along the moving direction of the film-like printing body, and a fixing clamp which is arranged in a rear side of the feeding clamp in the moving direction of the film-like printing body on the upper surface of the frame-like supporting table so as to be close to the feeding clamp, and clamps both end portions of the film-like printing body in the width direction at a suitable timing.

Further, in the structure mentioned above, as the moving means for the feeding clamp, it is desirable to employ a moving means constituted by a screw shaft which is arranged along the moving direction of the film-like printing body, a connection plate which is connected to a supporting body of the feeding clamp provided with a screw hole engaging with the screw shaft, and a drive motor which is fixed to the frame-like supporting table and connected to the screw shaft.

DESCRIPTION OF THE PREFERRED EMBODIMENT

A description will be given below of an embodiment in accordance with the present invention with reference to the accompanying drawings.

Figure 1:
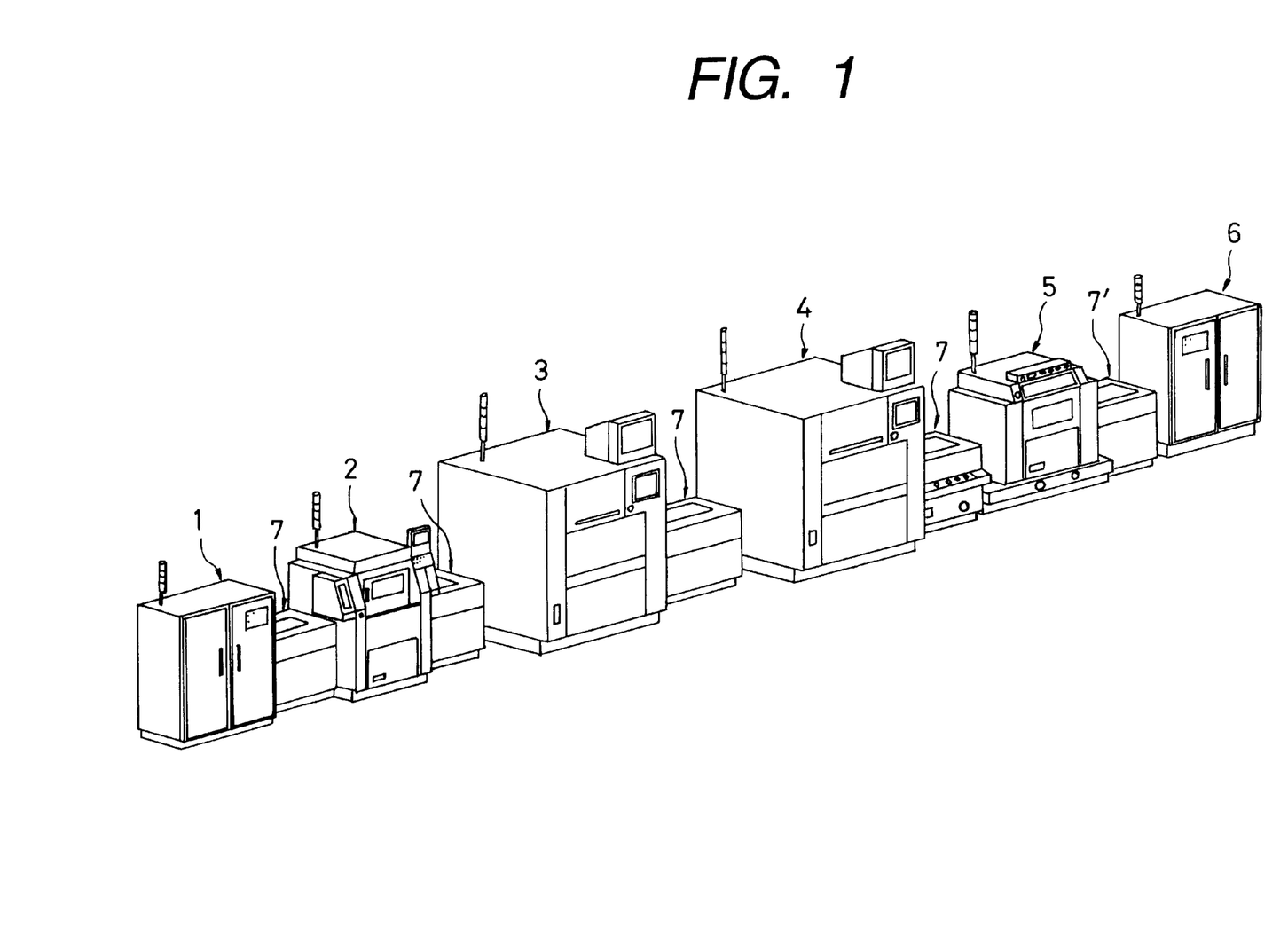
FIG. 1 is a perspective view of a whole of a continuous printing and mounting apparatus in accordance with the present invention.
Figure 2:
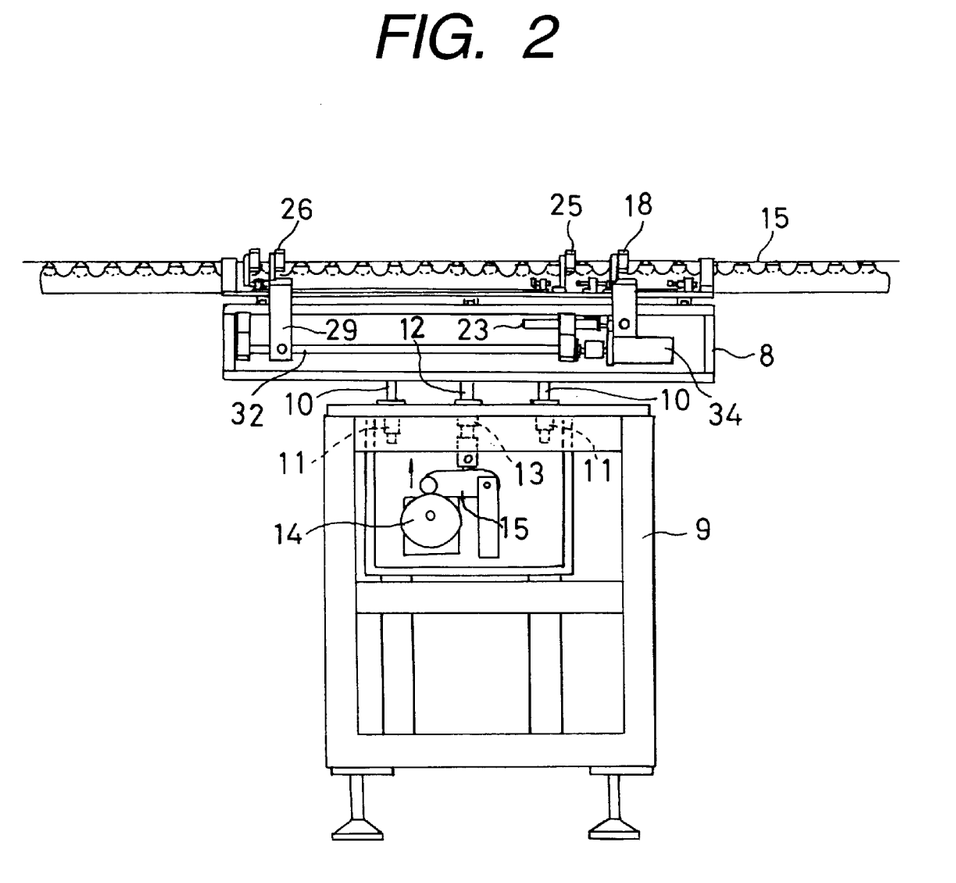
FIG. 2 is a front view of a state in which a cover of a tension apparatus is taken out.
Figure 3:
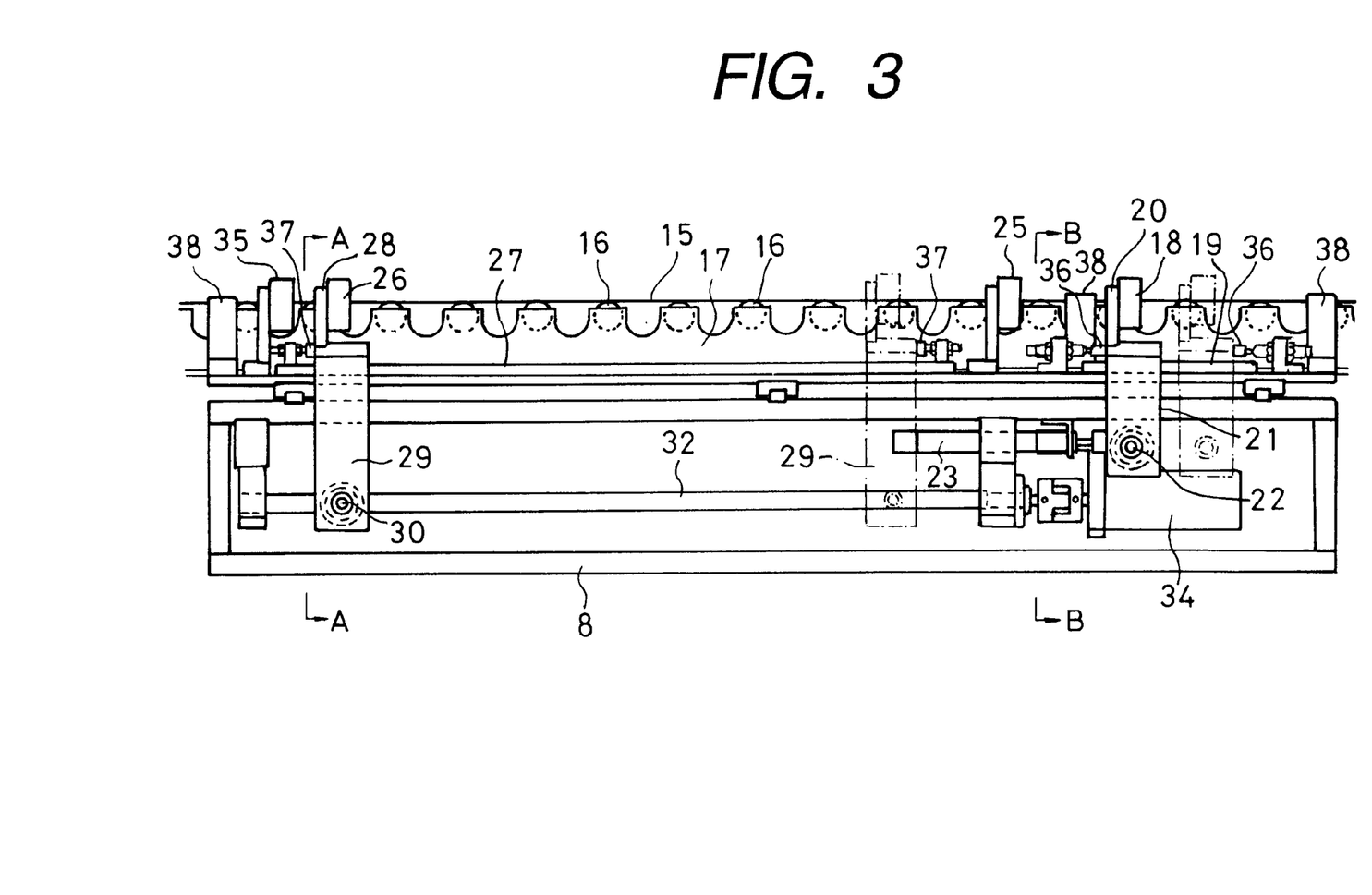
FIG. 3 is a front view of a main portion of the tension apparatus, in a partly omitting manner.
Figure 4:
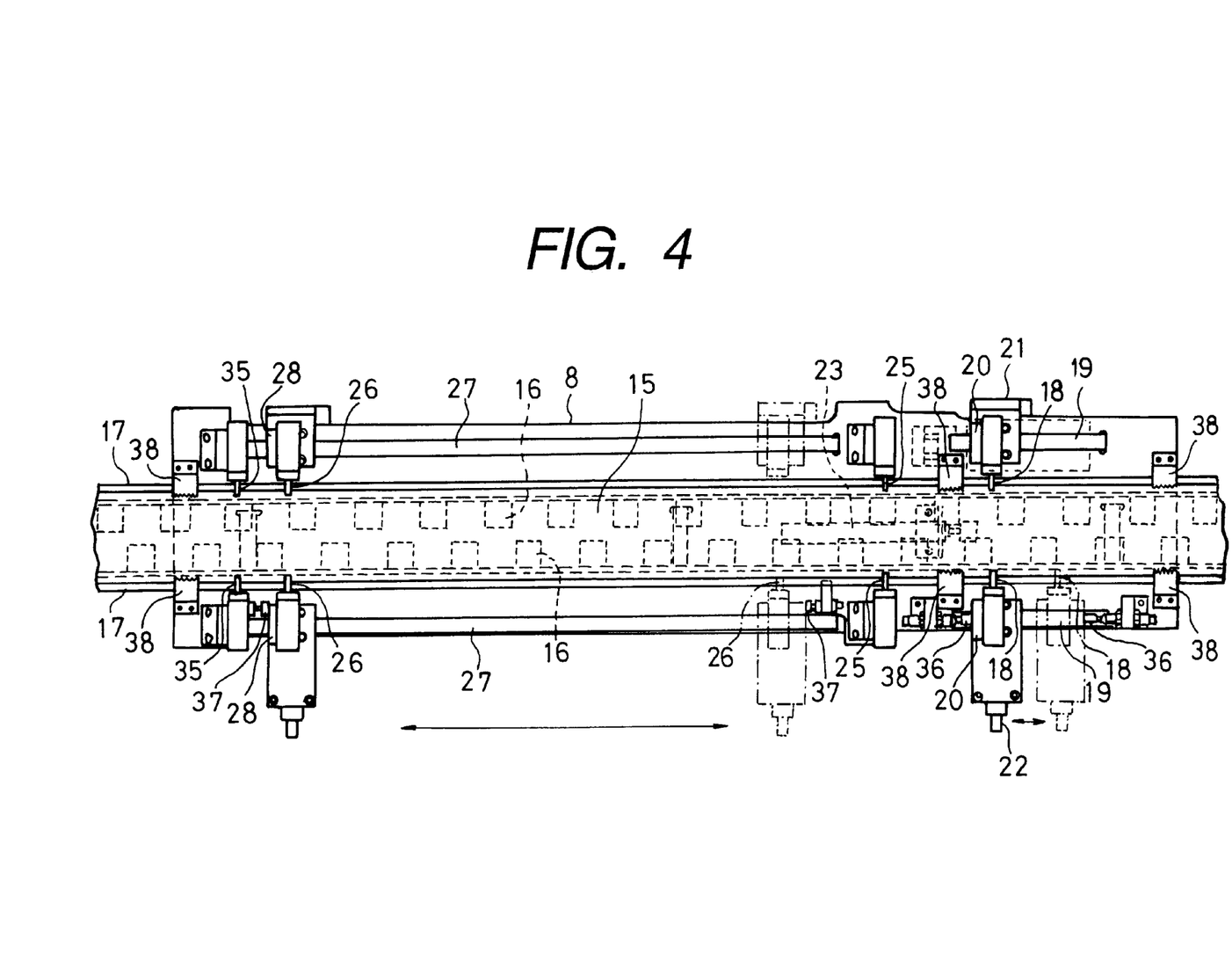
FIG. 4 is a plan view of a main portion of the tension apparatus, in a partly omitting manner.
Figure 5:
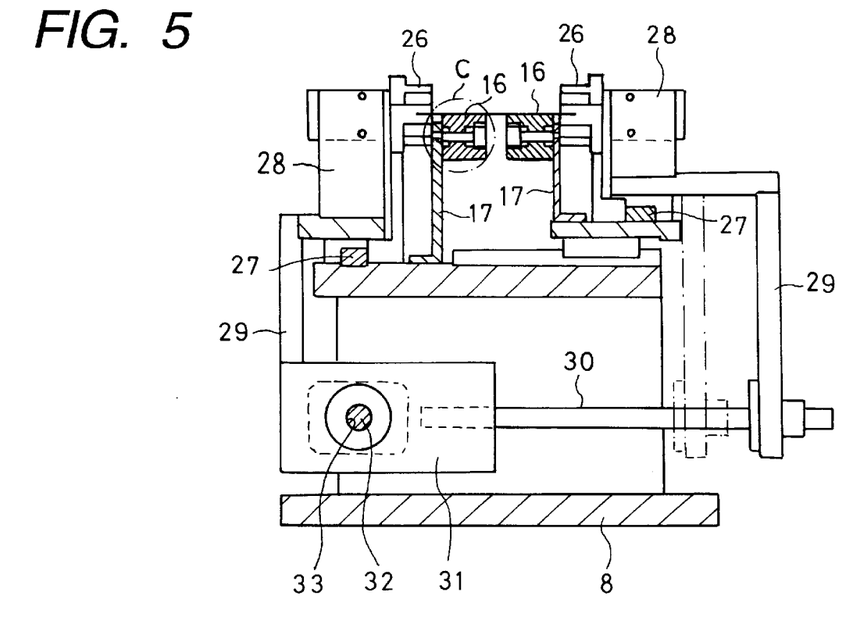
FIG. 5 is an enlarged cross sectional view along a line A—A in FIG. 3.
Figure 6:
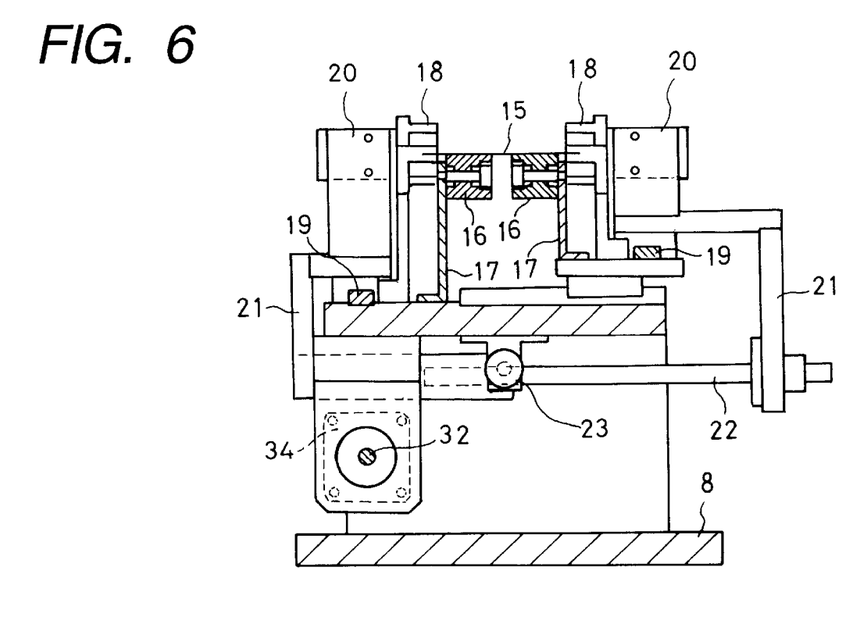
FIG. 6 is an enlarged cross sectional view along a line B—B in FIG. 3.
Figure 7:
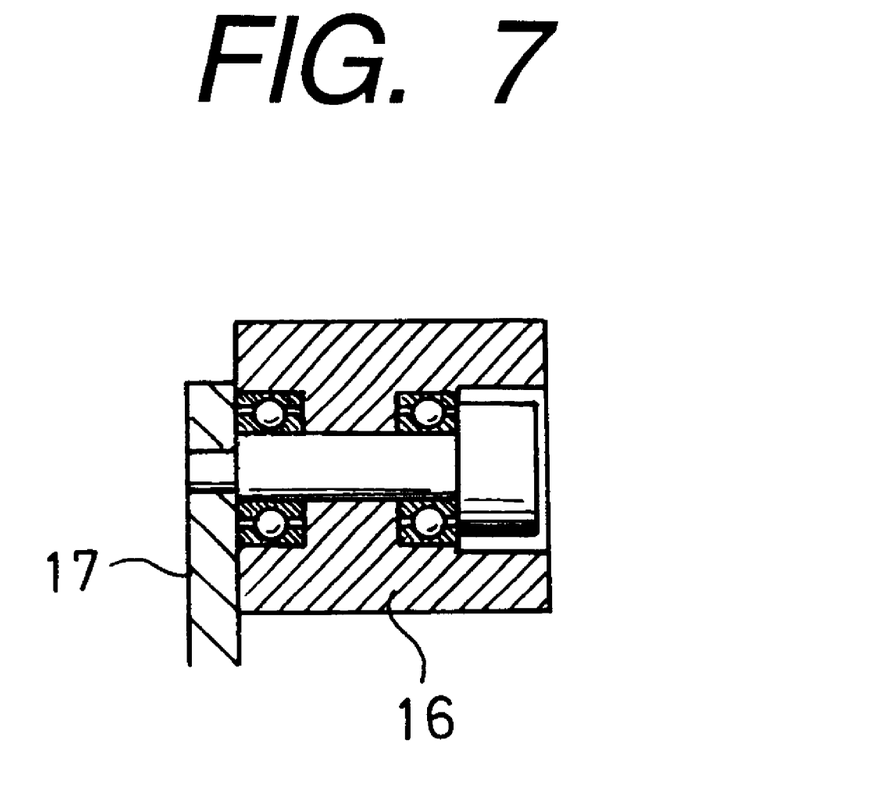
FIG. 7 is an enlarged view of a portion C in FIG. 5.
Figure 8:
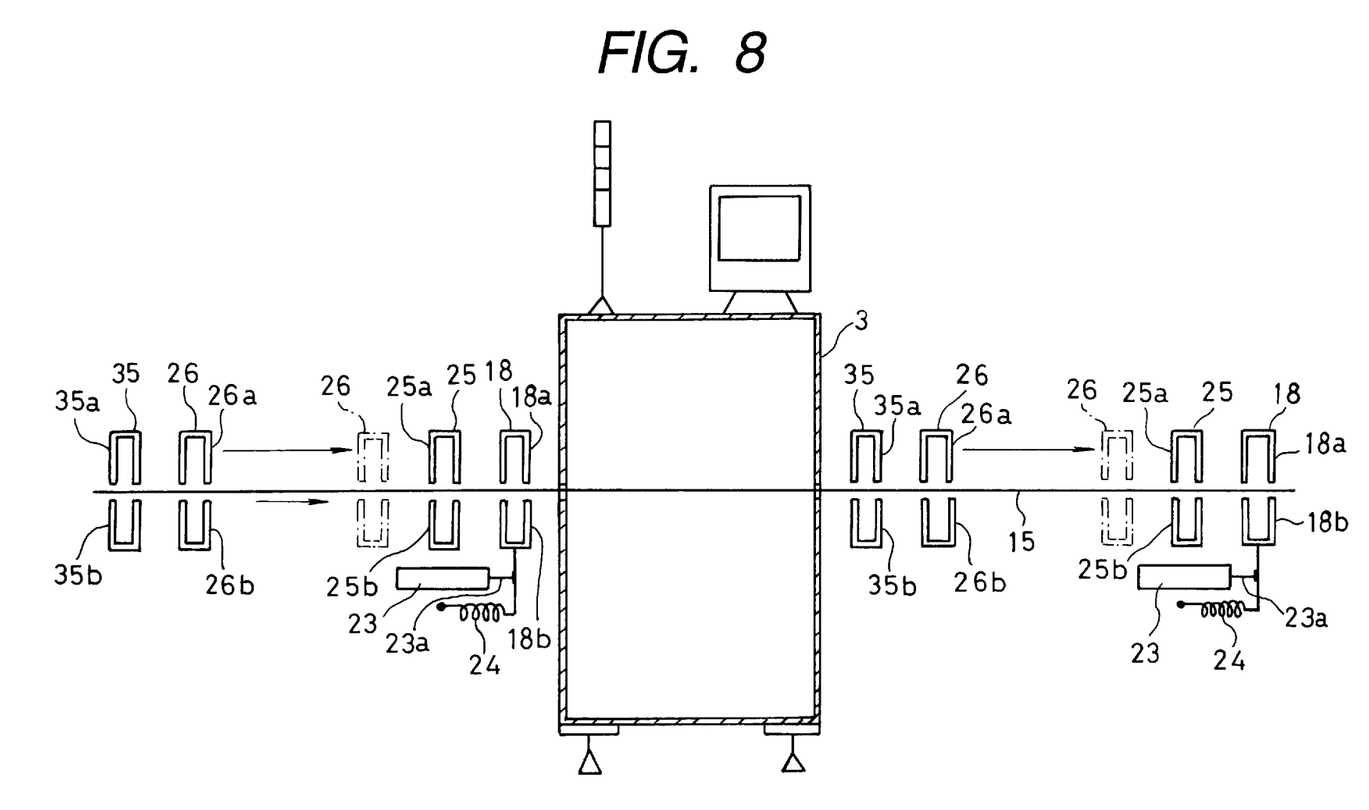
FIG. 8 is a schematic view of an arrangement and an operation of the tension apparatus.

FIG. 1 is a perspective view of a whole of a continuous printing and mounting apparatus, FIG. 2 is a front view of a state in which a cover of a tension apparatus is taken out, FIG. 3 is a front view of a main portion of the tension apparatus, in a partly omitting manner, FIG. 4 is a plan view of a main portion of the tension apparatus, in a partly omitting manner, FIG. 5 is an enlarged cross sectional view along a line A—A in FIG. 3, FIG. 6 is an enlarged cross sectional view along a line B-B in FIG. 3, FIG. 7 is an enlarged view of a portion C in FIG. 5, and FIG. 8 is a schematic view of an arrangement and an operation of the tension apparatus.

In the drawings, reference numeral 1 denotes a supply unit for a film-like printing body. The supply unit 1 feeds out a film-like printing body wound around a supply reel (not shown).

Reference numeral 2 denotes a printing unit which applies a printing operation to the film-like printing body. Further, the printing unit 2 corresponds to a screen printing apparatus which executes a printing operation by applying a printing agent such as a cream solder or the like by using a squeegee.

Reference numerals 3 and 4 denote a parts mounting unit which mounts parts on the printed film-like printing body. Reference numeral 5 denotes a heating unit which heats the heated film-like printing body mounting the parts thereon at a suitable temperature. Reference numeral 6 denotes a take-up unit which takes up the heated film-like printing body mounting the parts thereon by means of a take-up reel (not shown).

Then, the respective units mentioned above are sequentially arranged along a moving direction of the film-like printing body.

Further, tension apparatuses 7 and 7 constituted by the following elements are arranged between the respective units among the supply unit, the printing unit, the parts mounting unit and the heating unit. In this case, the tension apparatuses 7 and 7 are structured such as to apply tension to the film-like printing body during a process of the film-like printing body, and automatically feed out the processed film-like printing body by a predetermined stroke.

Reference numeral 8 denotes a frame-like supporting table. The frame-like supporting table 8 is mounted to an upper portion of a base table 9 in such a manner as to move upward and downward at a suitable timing. Further, reference numerals 10 and 10 denote guide rods which are suspended to a lower portion of the frame-like supporting table 8, reference numerals 11 and 11 denote guide sleeves which are slidably fitted to the guide rods 10 and 10 and are provided in the base table 9, reference numeral 12 denotes an elevating operation rod which is suspended to the lower portion of the frame-like supporting table 8, and reference numeral 13 denotes a guide sleeve which slidably fits the elevating operation rod 12 and is provided in the base table 9. Further, reference numeral 14 denotes a cam which is provided in the base table 9 and rotates in a vertical direction, and reference numeral 15 denotes an operation rod which is connected to a lower end portion of the elevating operation rod 12 and is swung in a vertical direction on the basis of a rotation of the cam 14.

Reference numeral 15 denotes a film-like printing body, and denotes a film-like printed circuit board in the present embodiment. Reference numerals 16 and 16 denote rotating rolls which are arranged along a moving direction of the film-like printing body 15 and receive the film-like printing body. The rotating rolls 16 and 16 are rotatably pivoted to the upper surface of the frame-like supporting table 8 through supporting rods 17 and 17.

References 18 and 18 denote tension clamps which clamp both end portions of the film-like printing body 15 in the width direction at a suitable timing. The tension clamps 18 and 18 are respectively constituted by a pair of upper and lower clamp bodies 18a and 18b. Further, the tension clamps 18 and 18 are arranged in a front end side in the moving direction of the film-like printing body 15 on an upper surface of the frame-like supporting table 8, and is mounted so as to move along the moving direction of the film-like printing body 15.

Reference numerals 19 and 19 denote guide rails which are provided on the upper surface of the frame-like supporting table 8 along the moving direction of the film-like printing body 15, and reference numerals 20 and 20 denote supporting bodies for the tension clamps 18 and 18. The supporting bodies 20 and 20 are respectively mounted slidably along the guide rails 19 and 19. Further, the supporting bodies 20 and 20 for the tension clamps are structured such as to be simultaneously moved respectively through suspended connection plates 21 and 21 and a connection rod 22 which connects the connection plates 21 and 21.

Reference numeral 23 denotes a cylinder which pushes the tension clamps 18 and 18 to a forward side in the moving direction of the film-like printing body 15 by a predetermined stroke. The cylinder 23 is fixed to the frame-like supporting table 8 along the moving direction of the film-like printing body 15. In this case, in the present embodiment, a piston rod 23a of the cylinder 23 is structured such as to be brought into contact with the connection rod 22 and be retracted after pushing the tension clamps 18 and 18 to be moved apart from the connection rod 22.

Reference numeral 24 denotes a tension coil spring having a suitable elasticity. The tension coil spring 24 energizes the tension clamps 18 and 18 pushed by the cylinder 23 toward a pulling back direction. In this case, the tension coil spring 24 is provided between the connection rod 22 and the frame-like supporting table 8, in the present embodiment.

Reference numerals 25 and 25 denote fixing clamps which are arranged in a rear side of the tension clamps 18 and 18 in the moving direction of the film-like printing body 15 on the upper surface of the frame-like supporting table 8 so as to be close to the tension clamps 18 and 18. Further, the fixing clamps 25 and 25 are respectively constituted by a pair of upper and lower clamp bodies 25a and 25b, and are structured such as to clamp both end portions of the film-like printing body 15 in the width direction at a suitable timing.

Reference numerals 26 and 26 denote feeding clamps which are respectively constituted by a pair of upper and lower clamp bodies 26a and 26b. The feeding clamps 26 and 26 clamp both end portions of the film-like printing body 15 in the width direction at a suitable timing, and are structured such as to feed out the processed film-like printing body by a predetermined stroke. Further, the feeding clamps 26 and 26 are arranged in a rear end side in the moving direction of the film-like printing body 15 on the upper surface of the frame-like supporting table 8, and are mounted so as to move along the moving direction of the film-like printing body 15.

Reference numerals 27 and 27 denote guide rails which are provided on the upper surface of the frame-like supporting table 8 along the moving direction of the film-like printing body 15, and reference numerals 28 and 28 denote supporting bodies for the feeding clamps 26 and 26. The supporting bodies 28 and 28 are respectively mounted slidably along the guide rails 27 and 27. Further, the supporting bodies 28 and 28 for the feeding clamps are structured such as to be simultaneously moved through connection plates 29 and 29 respectively suspended thereto, and a connection rod 30 and a connection plate 31 which connect the connection plates 29 and 29.

Reference numeral 32 denotes a screw shaft which moves the feeding clamps 26 and 26 at a predetermined timing, in a predetermined direction and by a predetermined stroke along the moving direction of the film-like printing body 15. Further, the screw shaft 32 is arranged along the moving direction of the film-like printing body 15, is screwed with a screw hole 33 provided in the connection plate 31 and is connected to a rotating shaft of a drive motor 34 which is fixed to the frame-like supporting table 8.

Reference numerals 35 and 35 denote fixing clamps which are arranged in a rear side of the feeding clamps 26 and 26 in the moving direction of the film-like printing body 15 on the upper surface of the frame-like supporting table 8 so as to be close to the feeding clamps 26 and 26. Further, the fixing clamps 35 and 35 are respectively constituted by a pair of upper and lower clamp bodies 35a and 35b, and are structured such as to clamp both end portions of the film-like printing body 15 in the width direction. Further, reference numerals 36, 36, 37 and 37 denote stoppers which respectively restrict the stroke, and reference numerals 38 and 38 denote restriction rods for preventing the film-like printing body from being floated up.

Next, a description will be given of an operation of the tension apparatus.

First of all, a description will be given of a case that the tension is applied to the film-like printing body 15. As shown in FIG. 8, first of all, the fixing clamps 25 and 35 at the right side of the parts mounting unit 3 in the drawing and the fixing clamps 25 and 35 at the left side of the parts mounting unit 3 in the drawing clamp the film printing body 15. Next, in this state, the tension clamps 18 and 18 at the left side of the parts mounting unit 3 in the drawing are pushed forward by a predetermined stroke in the moving direction of the film-like printing body 15 by using the cylinder 23. In this case, when this operation is finished, the piston rod of the cylinder 23 is retracted. Then, the pushed forward tension clamps 18 and 18 clamp the film-like printing body 15 and are pulled back by the tension coil spring 24. Accordingly, a part of the film-like printing body 15 within the parts mounting unit 3 is pulled in a length direction, and a suitable tension is applied on the basis of an elastic operation of the tension coil spring 24.

Next, a description will be given of feeding of the film-like printing body.

When the parts mounting is finished in a state in which a suitable tension is applied in the manner mentioned above, the tension clamps 18 and 18 by which the tension is applied stop the clamping operation and return to the original positions. Next, the feeding clamps 26 and 26 at the right side and the left side of the parts mounting unit 3 in the drawing simultaneously clamp the film-like printing body 15. Further, at the same time, the fixing clamps 25 and 35 at the right side of the parts mounting unit 3 in the drawing and the fixing clamps 25 and 35 at the left side in the drawing stop the clamping operation of the film-like printing body 15. Further, thereafter, the feeding clamps 26 and 26 move on the basis of the operation of the screw shaft 32 to transfer the film-like printing body 15 by the predetermined stroke in the moving direction thereof. Further, thereafter, the fixing clamps 25, 25, 35 and 35 again clamp the film-like printing body 15, and at the same time, the feeding clamps 26 and 26 stop the clamping operation and return to the original positions. In accordance with the manner mentioned above, all the steps are completed.

Further, a tension apparatus 7' which is different from the tension apparatuses 7 and 7 is arranged between the heating unit 5 and the take-up unit 6. In the tension apparatus 7', the structure is made such that the tension clamps 18 and 18, the cylinder 23 and the tension coil spring 24 in the tension apparatus 7 are removed. In this case, since the other structures are the same, a detailed description will be omitted.

Since the present invention has the structure and the operation mentioned above, it is possible to apply a suitable tension to the film-like printing body to be processed in each of the steps such as the printing step, the parts mounting step and the like. Further, at a time of feeding the film-like printing body by one pitch after the process is finished in each of the steps, the film-like printing body is all at once fed by the same stroke by a plurality of tension apparatuses which are respectively arranged between the processing units in the respective steps in correspondence to the take-up operation performed by the take-up unit. Accordingly, it is possible to solve the whole of the problems in the conventional art.

What is claimed is:

1. A continuous printing and mounting apparatus for a film-like printing body, comprising:
    a plurality of operating units sequentially arranged along a direction of motion of said film-like printing body, said operating units including:
        a supply unit containing a supply of the film-like printing body;
        a printing unit for applying printing to the film-like printing body;
        a part mounting unit for mounting parts on the printed film-like printing body; and
        a heating unit for heating the film-like printing body after the mounting of parts thereon by said part mounting unit, said continuous printing and mounting apparatus further comprising:
            a take-up unit for taking up the film-like printing body after the mounting of parts thereon and after the heating of the film-like printing body;
            a plurality of first tension apparatuses for applying a tension to said film-like printing body during a processing thereof, said first tension apparatuses being capable of automatically feeding out the processed film-like printing body by a predetermined stroke, each of said first tension apparatuses being arranged between a respective two of said operating units, said first tension apparatuses each including clamping elements for clamping said film-like printing body and further including means operatively connected to said clamping elements for translating said clamping elements along a direction of motion of said film-like printing body for feeding out the processed film-like printing body; and
            a second tension apparatus for applying a tension to said film-like printing body during a processing of the film-like printing body by the heating unit and for automatically feeding out the film-like printing body by a predetermined stroke after the processing of said film-like printing body by said heating unit, said second tension apparatus being arranged between the heating unit and the take-up unit.

2. A continuous printing and mounting apparatus for a film-like printing body as claimed in claim 1, wherein each of the first tension apparatuses includes:
    a frame-like supporting table mounted to an upper portion of a base table so as to move upward and downward with a suitable timing;
    a cover;
    a tension clamp arranged on an upper surface of the frame-like supporting table, said tension clamp being mounted so as to move along the direction of motion of the film-like printing body and so as to clamp the film-like printing body along opposing lateral edges thereof with a suitable timing, said tension clamp being one of said clamping elements;
    a pusher for pushing said tension clamp in the direction of motion of the film-like printing body by a predetermined stroke, said pusher including a drive cylinder, said pusher being part of said means for translating;
    a tension coil spring operatively connected to said tension clamp for pulling said tension clamp in a direction opposite to the direction of motion of said film-like printing body, after a shifting of said tension clamp by said pusher;
    a fixing clamp arranged on the upper surface of said frame-like supporting table upstream of said tension clamp, relative to the direction of motion of said film-like printing body, for clamping the lateral edges of the film-like printing body with a suitable timing;
    a feeding clamp arranged on the upper surface of said frame-like supporting table upstream of said fixing clamp, relative to the direction of motion of said film-like printing body, so as to be movable along the direction of motion of the film-like printing body and so as to clamps the lateral edges of the film-like printing body with a suitable timing, for feeding out the processed film-like printing body by a predetermined stroke;
    moving means operatively connected to said feeding clamp for moving said feeding clamp with a predetermined timing, in a predetermined direction and by a predetermined stroke along the direction of motion of the film-like printing body; and
    a fixing clamp arranged on the upper surface of said frame-like supporting table, upstream of said feeding clamp relative to the direction of motion of the film-like printing body, proximately to said feeding clamp, so as to clamp both lateral edges of the film-like printing body with a suitable timing.

3. A continuous printing and mounting apparatus for a film-like printing body as claimed in claim 2, wherein said cylinder is fixed to the frame-like supporting table and extends along the direction of motion of the film-like printing body.

4. A continuous printing and mounting apparatus for a film-like printing body as claimed in claim 2, wherein said moving means includes:
    a screw shaft arranged along the direction of motion of of the film-like printing body;
    a connection plate connected to a supporting body of the feeding clamp, said connection plate being provided with a screw hole engaging screw shaft; and a drive motor fixed to the frame-like supporting table and operatively connected to said screw shaft.

5. A continuous printing and mounting apparatus for a film-like printing body as claimed in claim 1, wherein said second tension apparatus includes:

a frame-like supporting table mounted to an upper portion of a base table so as to move upward and downward with a suitable timing;

a cover;

a fixing clamp arranged on an upper surface of the frame-like supporting table for clamping the lateral edges of the film-like printing body with a suitable timing;

a feeding clamp disposed on the upper surface of said frame-like supporting table, on an upstream side of said fixing clamp, relative to the direction of motion of the film-like printing body, said feeding clamp being mounted so as to move along the direction of motion of the film-like printing body and so as to clamp both lateral edges of the film-like printing body with a suitable timing for feeding out the processed film-like printing body by a predetermined stroke;

a suitable moving means operatively connected to said feeding clamp for moving said feeding clamp with a predetermined timing, in a predetermined direction and by a predetermined stroke along the direction of motion of the film-like printing body; and a fixing clamp disposed on the upper surface of said frame-like supporting table upstream of said feeding clamp, relative to the direction of motion of said film-like printing body, proximately to said feeding clamp, for clamping both lateral edges of the film-like printing body with a suitable timing.

6. A continuous printing and mounting apparatus for a film-like printing body as claimed in claim 5, wherein said moving means includes:

a screw shaft extending along the direction of motion of the film-like printing body;

a connection plate connected to a supporting body of the feeding clamp and provided with a screw hole engaging said screw shaft; and a drive motor fixed to the frame-like supporting table and operatively connected to said screw shaft.

\* \* \* \* \*